(12) United States Patent
Yamada et al.

(10) Patent No.: US 10,466,305 B2
(45) Date of Patent: Nov. 5, 2019

(54) INSPECTION APPARATUS AND INSPECTION METHOD OF BATTERY PACK FOR ON-SITE ELECTRIC APPARATUS

(71) Applicant: MAKITA CORPORATION, Anjo-shi, Aichi (JP)

(72) Inventors: Toru Yamada, Anjo (JP); Koji Takahashi, Anjo (JP)

(73) Assignee: MAKITA CORPORATION, Anjo-shi (JP)

(*) Notice: Subject to any disclaimer, the term of this patent is extended or adjusted under 35 U.S.C. 154(b) by 0 days.

(21) Appl. No.: 15/464,789

(22) Filed: Mar. 21, 2017

(65) Prior Publication Data

US 2017/0285108 A1 Oct. 5, 2017

(30) Foreign Application Priority Data

Mar. 31, 2016 (JP) ................ 2016-072237

(51) Int. Cl.
*G01R 31/36* (2019.01)
*G01R 31/3842* (2019.01)
*G01R 31/389* (2019.01)
*G01R 31/392* (2019.01)
*H02J 7/00* (2006.01)
*G01R 31/385* (2019.01)
*G01R 31/371* (2019.01)

(52) U.S. Cl.
CPC ....... *G01R 31/3842* (2019.01); *G01R 31/386* (2019.01); *G01R 31/389* (2019.01); *G01R 31/392* (2019.01); *H02J 7/0021* (2013.01); *G01R 31/371* (2019.01); *H02J 7/0047* (2013.01); *H02J 2007/0098* (2013.01)

(58) Field of Classification Search
None
See application file for complete search history.

(56) References Cited

U.S. PATENT DOCUMENTS

| 2003/0117105 | A1* | 6/2003 | Davis | H01M 10/441 320/107 |
| 2004/0124990 | A1* | 7/2004 | Zur | G01R 31/3644 340/636.1 |
| 2005/0253460 | A1* | 11/2005 | Nakanishi | B60K 6/32 307/10.1 |

(Continued)

FOREIGN PATENT DOCUMENTS

JP 2000-121710 A 4/2000

OTHER PUBLICATIONS

Guido J. Chiappori (These Présentée en vue d'obtenir le grade de Docteur en Spécialité: Génie Electrique, Oct. 2, 2015, 186 pages).*

*Primary Examiner* — Tung S Lau
(74) *Attorney, Agent, or Firm* — Oliff PLC

(57) ABSTRACT

One aspect of the present disclosure is an inspection apparatus of a battery pack for an on-site electric apparatus, which comprises a coupler, a discharger, a changer, a discharge performing device, a voltage value detector, and a calculator. The changer detects one of a nominal voltage value of the battery pack coupled to the coupler and a voltage value of a battery in the battery pack, and reduces a discharge time of the battery and/or a discharge current value of the battery as the detected value is larger.

13 Claims, 13 Drawing Sheets

(56) References Cited

U.S. PATENT DOCUMENTS

| | | | |
|---|---|---|---|
| 2009/0091332 A1* | 4/2009 | Emori | H02J 7/0018 324/537 |
| 2011/0084702 A1* | 4/2011 | Mori | H01M 10/441 324/430 |
| 2011/0112782 A1* | 5/2011 | Majima | G01R 31/361 702/63 |
| 2011/0187329 A1* | 8/2011 | Majima | H01M 10/48 320/149 |
| 2011/0309798 A1* | 12/2011 | Hara | H01M 4/131 320/134 |
| 2012/0081077 A1* | 4/2012 | Sasaki | H01M 10/425 320/134 |
| 2013/0069594 A1* | 3/2013 | Jung | H01M 10/425 320/112 |
| 2013/0088201 A1* | 4/2013 | Iwasawa | G01R 31/3679 320/118 |
| 2015/0032394 A1* | 1/2015 | Kimura | G01R 31/362 702/63 |
| 2015/0069973 A1* | 3/2015 | Yoshida | G01R 31/3828 320/118 |

* cited by examiner

FIG. 6
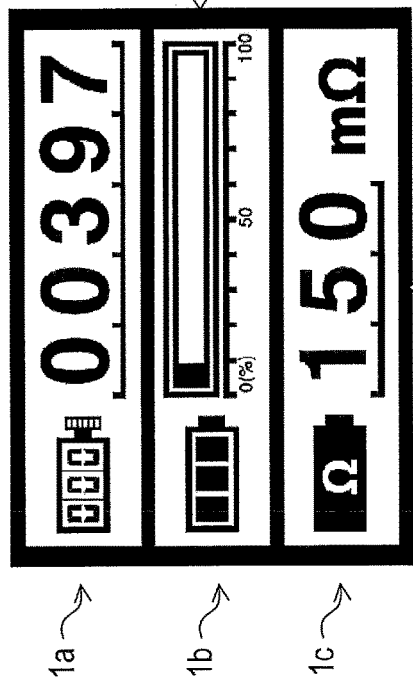
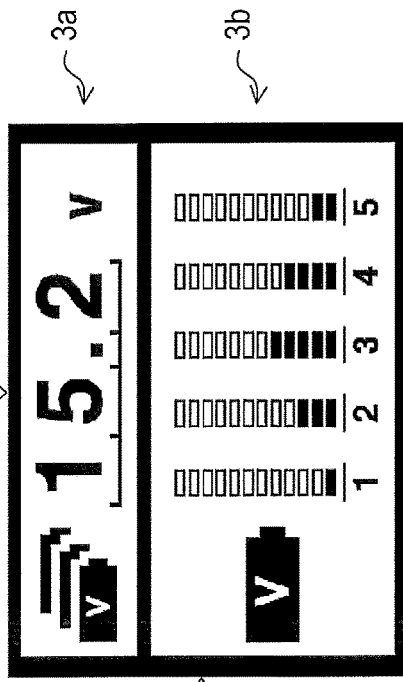
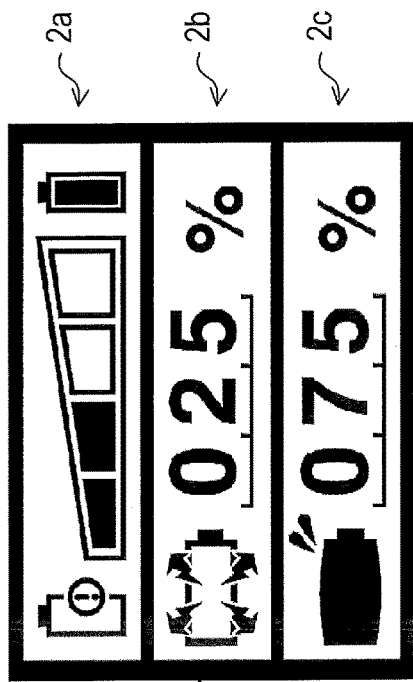
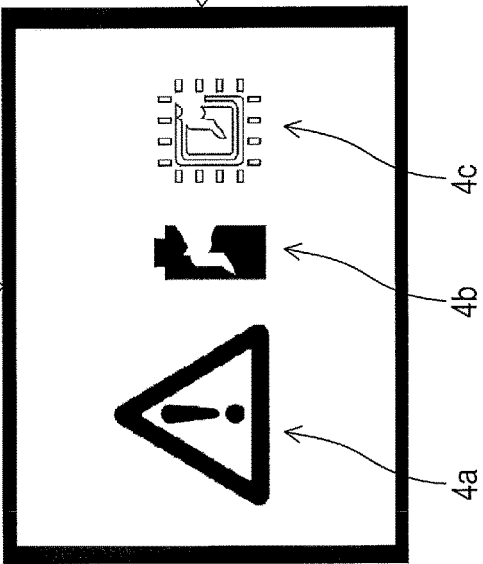

INSPECTION APPARATUS AND INSPECTION METHOD OF BATTERY PACK FOR ON-SITE ELECTRIC APPARATUS

CROSS-REFERENCE TO RELATED APPLICATIONS

This application claims the benefit of Japanese Patent Application No. 2016-072237 filed on Mar. 31, 2016 with the Japan Patent Office, the disclosure of which is incorporated herein by reference.

Background

The present disclosure relates to inspection of battery packs for on-site electric apparatuses.

Japanese Unexamined Patent Application Publication No. 2000-121710 discloses a technique in which a voltage of a rechargeable battery before performing a pulsed discharge and a voltage of the rechargeable battery during the pulsed discharge are detected, and an internal resistance value of the rechargeable battery is calculated using a difference between these detected battery voltages. The pulsed discharge is performed by a constant current discharge circuit. The constant current discharge circuit includes a transistor for discharge that is coupled between a positive electrode terminal and a negative electrode terminal of the rechargeable battery, and discharge at a constant current is performed by turning on the transistor.

SUMMARY

According to the aforementioned technique, an improved calculation accuracy of the internal resistance value can be achieved by lengthening a discharge time of the rechargeable battery to some extent or by increasing a discharge current to some extent. Specifically, a longer discharge time enables detection of a battery voltage that is decreased by discharge and has become sufficiently stable, and thus enables obtainment of the aforementioned difference indicating the internal resistance value more correctly. A large discharge current increases an amount of decrease in voltage of the rechargeable battery, thus facilitating obtainment of the aforementioned difference indicating the internal resistance value.

Problems described below may be caused in an inspection apparatus to detect an internal resistance value of a battery pack for an electric power tool, and more specifically, an internal resistance value of a battery installed in the battery pack using the above-described technique.

A nominal voltage of a battery pack, and more specifically, a nominal voltage of a battery installed in a battery pack may vary depending on a type of the battery pack. A nominal voltage is a value specified as an approximate voltage between terminals that is obtained when a battery is used under normal conditions, and is usually indicated on a battery pack.

Here, two types of battery packs having different nominal voltages are taken as an example. Assuming that the discharge time and the discharge current are the same to detect respective internal resistance values of these battery packs, power consumption and heat generation of the aforementioned transistor will be larger when detecting the internal resistance value of the battery pack having a larger nominal voltage than when detecting the internal resistance value of the battery pack having a smaller nominal voltage. Accordingly, selection and heat dissipation design of the transistor should be performed based on the battery pack having the larger nominal voltage. Thus, it is required to use a large transistor with a very high rated power, or to mount a large heat dissipation fin to the transistor, thereby leading to upsizing of an inspection apparatus.

It is desirable in one aspect of the present disclosure to provide a technique that enables downsizing of an inspection apparatus of a battery pack for an on-site electric apparatus.

One aspect of the present disclosure is an inspection apparatus of a battery pack for an on-site electric apparatus. The inspection apparatus comprises a coupler, a discharger, a changer, a discharge performing device, a voltage value detector, and a calculator. The coupler is configured to be coupled to the battery pack. The battery pack comprises a battery having a positive electrode terminal and a negative electrode terminal. The discharger comprises a transistor, which is coupled between the positive electrode terminal and the negative electrode terminal of the battery in the battery pack coupled to the coupler, and the discharger is configured to discharge the battery via the transistor. The changer is configured to detect one of a nominal voltage value of the battery pack coupled to the coupler and a voltage value of the battery in the battery pack, and to reduce a discharge time of the battery and/or a discharge current value of the battery as the detected value is larger. The discharge performing device is configured to cause the discharger to operate during the discharge time to thereby discharge the battery during the discharge time. The voltage value detector is configured to detect a first voltage value and a second voltage value. The first voltage value is a voltage value of the battery before the discharge performing device starts discharging of the battery. The second voltage value is a voltage value of the battery during discharging of the battery. The calculator is configured to calculate an internal resistance value of the battery based on the discharge current value and on a difference value between the first voltage value and the second voltage value detected by the voltage value detector.

According to the inspection apparatus as described above, power consumption and heat generation of the transistor can be reduced when detecting the internal resistance value of a battery pack having a high nominal voltage.

Thus, it is possible to use a compact transistor with a low rated power, or to downsize a heat dissipation fin to be mounted to the transistor, or to omit the heat dissipation fin. Consequently, downsizing of an inspection apparatus can be achieved.

In a case where the discharge time is set to a fixed short time period, and the discharge current value is set to a fixed small value, it is likely that calculation accuracy of the internal resistance value of any battery pack will be lowered.

However, the above-described inspection apparatus enables to avoid lowering of calculation accuracy of a battery pack with a low nominal voltage. In other words, according to the above-described inspection apparatus, good detection performance and downsizing of an inspection apparatus can be achieved in a well-balanced manner.

The inspection apparatus may further comprise a discharge current value detector configured to detect the discharge current value. In this case, the calculator may be further configured to calculate the internal resistance value based on the discharge current value detected by the discharge current value detector and on the difference value.

Alternatively, the calculator may be further configured to calculate the internal resistance value based on the discharge current value that is set and on the difference value.

The changer may be further configured to determine a magnitude of the detected value based on at least one preset threshold value. The changer may be configured to reduce the discharge time. According to the inspection apparatus configured as described above, it is not necessary to provide a hardware configuration to change the discharge current value by the discharger, and thus to facilitate simplifying the configuration of the inspection apparatus. The changer may be configured to obtain, from the battery pack, data enabling to specify the nominal voltage value and to detect the nominal voltage value based on the obtained data. According to the inspection apparatus configured as described above, it is possible to correctly detect the nominal voltage value.

Alternatively, the changer may be configured to detect the nominal voltage value based on the voltage value of the battery. According to the inspection apparatus configured as described above, the nominal voltage value can be detected even if the data enabling to specify the nominal voltage value cannot be obtained from the battery pack.

The inspection apparatus may comprise a circuit board. In this case, the transistor may comprise one surface and be mounted on the circuit board such that the one surface contacts the circuit board. The inspection apparatus configured as described above can be further downsized easily. It is because in such inspection apparatus, heat is dissipated from the transistor to the circuit board, thus allowing use of a further compact transistor and a lower height of the transistor mounted on the circuit board.

The inspection apparatus may further comprise a display processor configured to cause a display device to display the internal resistance value calculated by the calculator. The inspection apparatus configured as described above enables to notify a user of the inspection apparatus about the calculated internal resistance value.

The discharger may be further configured to discharge the battery constantly at the discharge current value. In this case, the internal resistance value of the battery pack can be detected more accurately. The discharger may be further configured to turn on the transistor to discharge the battery.

The coupler may be further configured such that the battery pack is attached to the coupler.

Another aspect of the present disclosure is an inspection method of a battery pack for an on-site electric apparatus, the battery pack having a positive electrode terminal and a negative electrode terminal. The inspection method comprises: coupling a transistor between the positive electrode terminal and the negative electrode terminal of the battery in the battery pack; detecting one of a nominal voltage value of the battery pack and a voltage value of the battery in the battery pack; setting a discharge time of the battery and/or a discharge current value of the battery such that the discharge time and/or the discharge current value are/is reduced as the detected value is larger; discharging the battery via the transistor during the discharge time; detecting a first voltage value, the first voltage value being a voltage value of the battery before discharging of the battery is started; detecting a second voltage value, the second voltage value being a voltage value of the battery during discharging of the battery; calculating a difference value between the detected first voltage value and the detected second voltage value; and calculating an internal resistance value of the battery based on the discharge current value and on the calculated difference value. The inspection method as described above may achieve the same effects as those of the above-described inspection apparatus.

BRIEF DESCRIPTION OF THE DRAWINGS

Hereinafter, example embodiments of the present disclosure will be described, by way of example, with reference to the accompanying drawings, in which:

FIG. 6 is an explanatory diagram illustrating a first image to a fourth image as diagnosis result images;

DETAILED DESCRIPTION OF THE PREFERRED EMBODIMENTS

First Embodiment

<Configuration>

Figure 1:
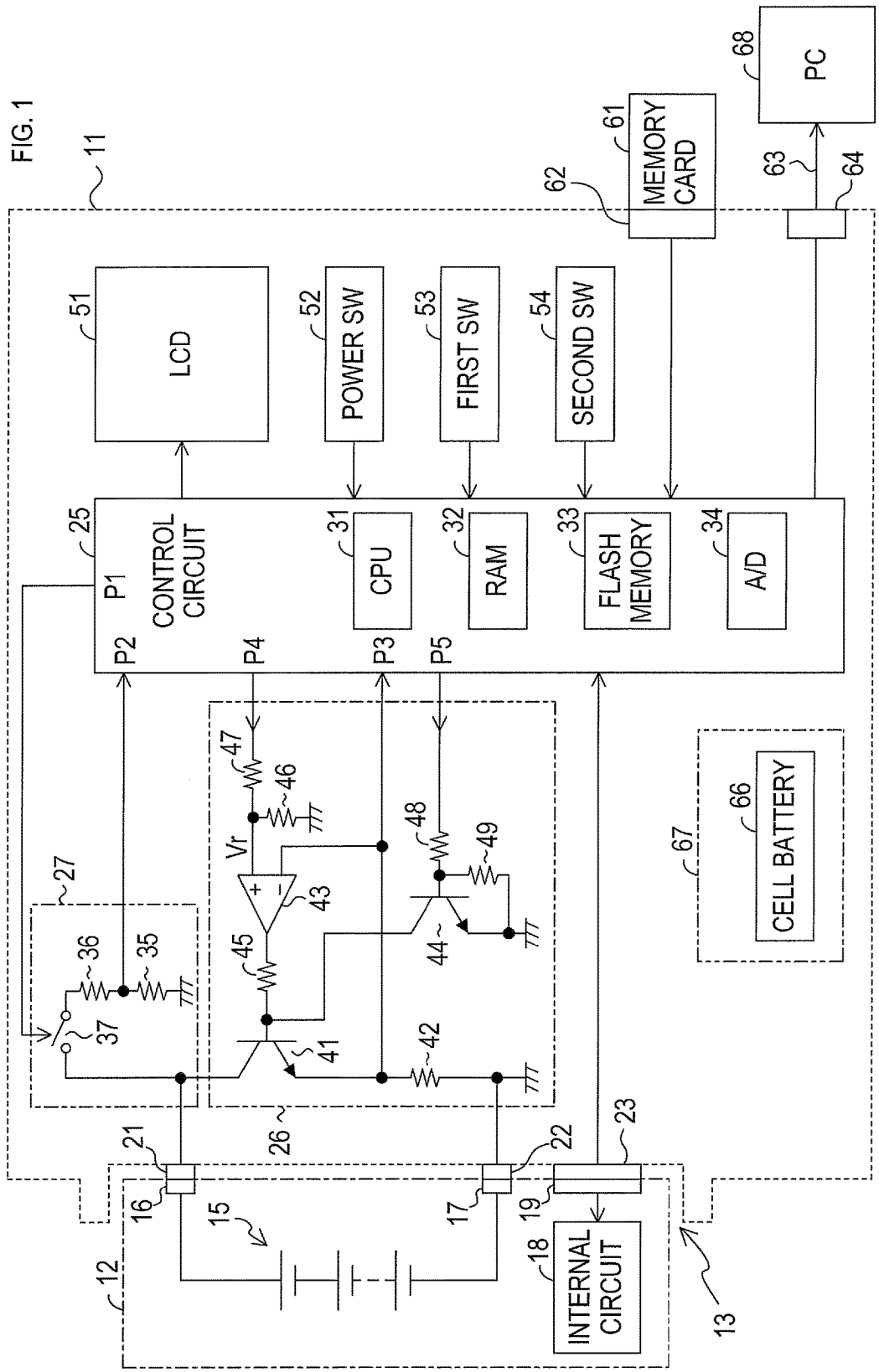
FIG. 1 is a configuration diagram showing a configuration of a battery checker of a first embodiment.

A battery checker 11 shown in FIG. 1 is one example of an inspection apparatus, and comprises an attachment portion 13 to which a battery pack 12 is detachably attached. The battery checker 11 performs inspection (or diagnosis) of the battery pack 12 that is attached to the attachment portion 13. The battery pack 12 is used as a power source of an on-site electric apparatus (not shown). The on-site electric apparatus may include electric apparatuses used at various work sites of, for example, do-it-yourself carpentry, manufacturing, gardening, construction. Specifically, the on-site electric apparatus may be, for example, an electric power tool for masonry work, metalworking, or woodworking, or a working machine for gardening, or an electric apparatus for preparing an environment of a work site. More specifically, the on-site electric apparatus may be, for example, an electric hammer, an electric hammer drill, an electric drill, an electric driver, an electric wrench, an electric grinder, an electric circular saw, an electric reciprocating saw, an electric jigsaw, an electric cutter, an electric chainsaw, an electric plane, an electric nailer (including an electric tacker), an electric hedge trimmer, an electric lawn mower, an electric lawn trimmer, an electric grass cutter, an electric cleaner, an electric blower, an electric sprayer, an electric spreader, an electric dust collector, a work light, or an audio device for work sites, such as a radio and a speaker.

Specifically, the battery pack 12 comprises a rechargeable battery 15 and terminals 16 and 17. The battery 15, which may be, for example, a lithium ion battery, comprises a plurality of serially coupled rechargeable cells. The terminal 16 is a positive electrode terminal of the battery 15, and the terminal 17 is a negative electrode terminal of the battery 15. That is, a voltage of the battery 15 (hereinafter referred to as a "battery voltage") is outputted from the battery pack 12 via the terminals 16 and 17.

Also, the battery pack 12 comprises an internal circuit 18 and a communication connector 19. The internal circuit 18 performs diagnosis of the battery 15 and self-diagnosis of the internal circuit 18. The communication connector 19 comprises a plurality of signal terminals to enable the internal circuit 18 to communicate with external circuits and devices.

The attachment portion 13 of the battery checker 11 comprises terminals 21 and 22, and a communication connector 23.

The terminals 21 and 22 are coupled, respectively, to the terminals 16 and 17 of the battery pack 12 that is attached to the attachment portion 13. Also, the terminal 22 is coupled to the ground line of the battery checker 11. In other words, when the battery pack 12 is attached to the attachment portion 13, the battery voltage appears at the terminal 21 with respect to an electrical potential of the terminal 22.

The communication connector 23 comprises a plurality of signal terminals, similarly to the communication connector 19 of the battery pack 12. The communication connector 23 engages with the communication connector 19 of the battery pack 12 that is attached to the attachment portion 13. When the communication connector 19 and the communication connector 23 engage with each other, each of the signal terminals of the communication connector 19 is coupled to a corresponding one of the signal terminals of the communication connector 23. As a result, the internal circuit 18 of the battery pack 12 and the battery checker 11 are coupled in a data communicable manner.

The battery checker 11 comprises a control circuit 25, a discharge circuit 26, and a voltage input circuit 27. The control circuit 25 controls operation of the battery checker 11. The discharge circuit 26 discharges the battery 15 in the battery pack 12 attached to the attachment portion 13 at a constant current. The voltage input circuit 27 inputs the battery voltage to the control circuit 25. Hereinafter, the battery 15 in the battery pack 12 attached to the attachment portion 13 will be also referred to as an attached battery 15. Accordingly, the battery voltage indicates a voltage of the attached battery 15.

The control circuit 25 comprises a microcomputer comprising a CPU 31, a RAM 32, a data-rewritable non-volatile flash memory 33, and an A/D converter 34, and other components. Each of various functions of the control circuit 25 is achieved by execution by the CPU 31 of a program stored in the flash memory 33, which is one example of a non-transitory substantive recording medium. Also, through execution of the program, a method corresponding to the program is executed. The control circuit 25 may comprise a microcomputer, or may comprise a plurality of microcomputers. Methods to achieve the various functions of the control circuit 25 are not limited to software, and a part of, or all of, the functions of the control circuit 25 may be achieved using hardware by combining a logical circuit, an analog circuit, and the like. More specifically, a part of, or all of, the functions of the control circuit 25 may be achieved by a combination of various individual electronic parts, or may be achieved by Application Specified Integrated Circuit (ASIC), by Application Specific Standard Product (ASSP), by a programmable logic device, such as Field Programmable Gate Array (FPGA), or by any combination of these.

The voltage input circuit 27 comprises serially coupled resistors 35 and 36, and a measurement switch 37. More specifically, a first end of the resistor 35 is coupled to a first end of the resistor 36, whereas a second end of the resistor 35 is coupled to the ground line. A second end of the resistor 36 is coupled to the terminal 21 when the measurement switch 37 is turned on. When the measurement switch 37 is turned on, the battery voltage divided by the resistors 35 and 36 appears at a connection point between the resistor 35 and the resistor 36. The measurement switch 37 may be, for example, a metal-oxide semiconductor field-effect transistor (MOSFET). The measurement switch 37 can be turned on/off by a signal outputted from an output terminal P1 of the control circuit 25. Also, the voltage at the connection point between the resistor 35 and the resistor 36 is inputted to an input terminal P2 of the control circuit 25.

When detecting the battery voltage, the control circuit 25 turns on the measurement switch 37, and detects a voltage value at the input terminal P2, that is, a voltage value at the connection point between the resistor 35 and the resistor 36. Then, the control circuit 25 calculates a value of the battery voltage based on the detected voltage value. Specifically, if the resistor 35 has a resistance value R35 and the resistor 36 has a resistance value R36, a value is calculated as the value of the battery voltage by multiplying the voltage value at the input terminal P2 by "(R35+R36)/R35." Then, the calculated value is regarded as a detected value of the battery voltage. The reason for providing the measurement switch 37 is to prevent or reduce wasteful consumption of electric power of the attached battery 15 resulting from continuous current flow from the attached battery 15 to the resistors 35 and 36.

The discharge circuit 26 comprises a transistor 41, resistors 42 and 45 to 49, an operational amplifier 43, and a transistor 44. The transistor 41, which is a transistor to discharge the battery 15, may be, for example, an NPN power transistor. More specifically, two Darlington-connected NPN transistors may be installed in the transistor 41. A collector of the transistor 41 is coupled to the terminal 21, and an emitter of the transistor 41 is coupled to a first end of the resistor 42. A second end of the resistor 42 is coupled to the terminal 22 and the ground line. Accordingly, the transistor 41 is coupled between the positive electrode terminal 16 and the negative electrode terminal 17 of the attached battery 15 via the resistor 42. The resistor 42 is a resistor to detect a discharge current of the attached battery 15.

A connection point between the emitter of the transistor 41 and the resistor 42 is coupled to an inverting input terminal of the operational amplifier 43 and an input terminal P3 of the control circuit 25. A base of the transistor 41 is coupled via the resistor 45 to an output terminal of the operational amplifier 43. A non-inverting input terminal of the operational amplifier 43 is coupled to a connection point between a first end of the resistor 46 and a first end of the resistor 47. A second end of the resistor 46 is coupled to the ground line, and a second end of the resistor 47 is coupled to an output terminal P4 of the control circuit 25.

The transistor 44 may be, for example, an NPN small signal transistor. A collector of the transistor 44 is coupled to the base of the transistor 41, and an emitter of the transistor 44 is coupled to the ground line. A base of the transistor 44 is coupled via the resistor 48 to an output terminal P5 of the control circuit 25. The base of the transistor 44 is further coupled via the resistor 49 to the emitter of the transistor 44.

When stopping operation of the discharge circuit 26, the control circuit 25 sets a voltage level of the output terminal P4 to Low and also sets a voltage level of the output terminal P5 to High. A voltage of each of the output terminals P1 to P5 of the control circuit 25 becomes 0 V when the voltage level is set to Low, and becomes, for example, 3.3 V when the voltage level is set to High. When the voltage level of the output terminal P5 is set to High, the transistor 44 is turned on, and thus the transistor 41 is turned off.

When causing the discharge circuit 26 to operate, the control circuit 25 sets the voltage level of the output terminal P4 to High and also sets the voltage level of the output terminal P5 to Low. When the voltage level of the output terminal P5 is set to Low, the transistor 44 is turned off, and thus the transistor 41 can be turned on by an output of the operational amplifier 43. A voltage of the non-inverting input terminal of the operational amplifier 43 is a voltage obtained by dividing, by the resistors 46 and 47, the voltage of the output terminal P4 when the voltage level is set to High. The operational amplifier 43 adjusts a magnitude of current to flow from the output of the operational amplifier 43 into the base of the transistor 41 such that the voltage at the connection point between the emitter of the transistor 41 and the resistor 42 is equal to the voltage of the non-inverting input terminal of the operational amplifier 43. Accordingly, a value Ic of a constant discharge current discharged via the transistor 41 from the attached battery 15 is indicated by "Vr/R42" when a value of the voltage of the non-inverting input terminal of the operational amplifier 43 is Vr, and a resistance value of the resistor 42 is R42. In the present embodiment, the respective resistance values of the resistors 46 and 47, and R42 are selected such that the value Ic is 2 amperes.

Also, the control circuit 25 detects an actual value of the discharge current from the attached battery 15 by detecting a value of a voltage of the input terminal P3, that is, a value of a voltage of the connection point between the emitter of the transistor 41 and the resistor 42, during operation of the discharge circuit 26. Specifically, the control circuit 25 calculates a value of the discharge current by dividing the detected value of the voltage of the input terminal P3 by R42. The calculated value of the discharge current is regarded as a detected value of the discharge current.

The battery checker 11 further comprises a Liquid Crystal Display (LCD) 51 as one example of a display device, a power switch (SW) 52, a first switch (SW) 53, a second switch (SW) 54, a card slot 62, and a terminal port 64. The LCD 51, which is a monochrome LCD in this example, may be a color LCD. The first switch 53 and the second switch 54 are switches to change images to be displayed on the LCD 51. The card slot 62 is designed for attachment of a memory card 61. The terminal port 64 is designed for insertion of a terminal of a Universal Serial Bus (USB) cable 63.

The battery checker 11 also comprises a containing portion 67 to contain a cell battery 66. Electric power for operation of the battery checker 11 is supplied from the cell battery 66 contained in the containing portion 67. Although only one cell battery 66 is shown in FIG. 1, the containing portion 67 may contain a plurality of cell batteries each having a specified shape (for example, four AA cell batteries).

The memory card 61 may be an SDHC (Registered Trademark) memory card, or may be a memory card of a different standard or type. By inserting the memory card 61 into the card slot 62, it is possible to rewrite a program stored as firmware in the flash memory 33 of the control circuit 25 to a program in the memory card 61, to thereby change an operation specification of the battery checker 11.

Also, the battery checker 11 can be coupled via the USB cable 63 to an external personal computer (PC) 68 or a not shown AC adapter. In the present embodiment, the terminal port 64 may be a port for a B-type micro USB terminal or may be a port with a different shape.

Further, the battery checker 11 is so-called USB power supply applicable, and can be powered by the PC 68 or the AC adapter via the USB cable 63. Accordingly, the battery checker 11 does not use the electric power of the cell battery 66, during USB power supply, and thus can operate without the cell battery 66. The battery checker 11 also has a function of transmitting information about the battery pack 12, etc. to the PC 68 coupled via the USB cable 63.

<Information Obtained from Internal Circuit of Battery Pack>

The battery checker 11 obtains information, for example, as listed in (1) to (9) below from the internal circuit 18 of the battery pack 12.

(1) Data enabling to specify a nominal voltage value of the battery pack 12: the data may be, for example, data indicating a model number of the battery pack 12. In the present embodiment, identification data (hereinafter, a "nominal voltage ID") indicating the nominal voltage value is transmitted from the internal circuit 18 of the battery pack 12 to the battery checker 11.

(2) Number of charges: the number of charges of the battery 15.

(3) Remaining energy of battery: a remaining charged energy of the battery 15.

(4) Battery life: a remaining life of the battery 15.

(5) Over-discharge tendency: a tendency that the battery 15 is used to reach an over-discharge state. The over-discharge tendency may be calculated, for example, as a ratio of the number of use of the battery 15 to reach the over-discharge state to the total number of use of the battery 15 (corresponding to the total number of charges of the battery 15). The over-discharge state means a state in which the remaining energy of the battery has excessively decreased.

(6) Overload operation rate: a rate that the battery 15 is used in an overload state. The overload operation rate may be calculated, for example, as a ratio of the number of use of the battery 15 in the overload state to the total number of use of the battery 15 (corresponding to the total number of charges of the battery 15). The overload state is a state in which an excess current flows from the battery 15.

(7) Respective block voltages: voltages of respective cells included in the battery 15.

(8) Cell diagnosis result: a result of diagnosis on whether any cell in the battery 15 has a failure.

(9) Circuit diagnosis result: a self-diagnosis result of the internal circuit 18. That is, a result of diagnosis on whether the internal circuit 18 has a failure.

<Control Process Executed by Control Circuit>

In the battery checker 11, when a power switch 52 is kept on for a specified time period (for example, 1 second) by a user, electric power is supplied to various components, such as the control circuit 25 and the LCD 51, and the control circuit 25 is activated. Activation of the control circuit 25 leads to activation of the battery checker 11.

Figure 2:
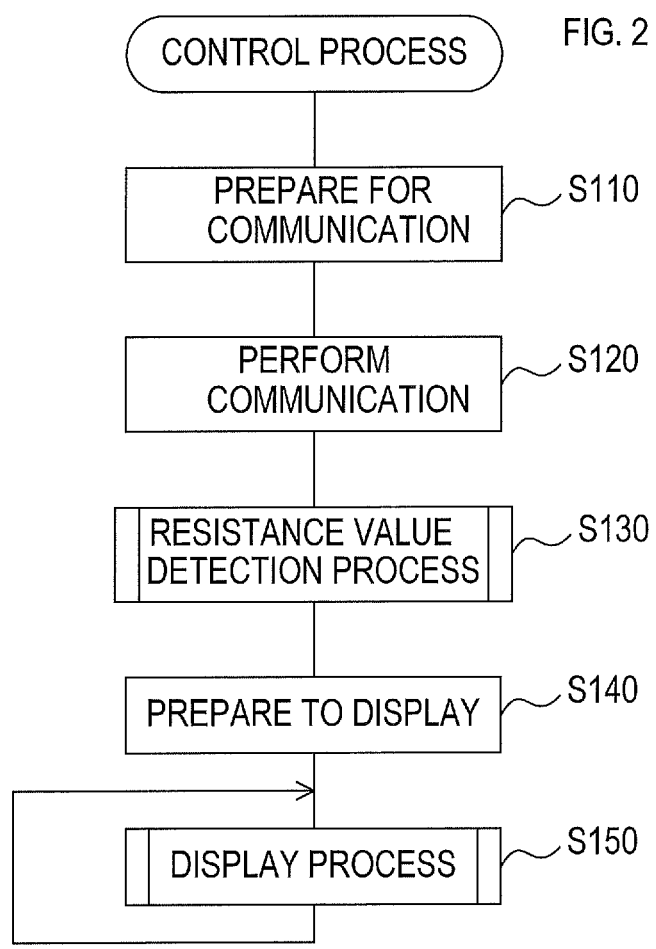
FIG. 2 is a flowchart showing a control process.

When activated, the control circuit 25 displays an initial image on the LCD 51, and starts a control process shown in FIG. 2. When the first switch 53 is turned on by the user while the initial image is displayed, the control circuit 25 increases an image contrast of the LCD 51 (that is, a display density), whereas when the second switch 54 is turned on by the user, the control circuit 25 decreases the image contrast.

As shown in FIG. 2, after starting the control process, the control circuit 25 executes a preparation process to communicate with the internal circuit 18 of the battery pack 12 in S110.

The preparation process comprises a process to detect that the battery pack 12 is attached to the attachment portion 13. In the present embodiment, when the battery pack 12 is attached to the attachment portion 13, a voltage of a specific signal terminal in the communication connector 23 is changed from a specified voltage to a different voltage. The control circuit 25 determines whether the battery pack 12 is attached to the attachment portion 13 based on the voltage of the specific signal terminal.

After determining that the battery pack 12 is attached to the attachment portion 13, the control circuit 25 proceeds to S120, and performs communication with the internal circuit 18 of the battery pack 12. Through the communication with the internal circuit 18, the control circuit 25 reads the aforementioned information (1) to (9) from the internal circuit 18. Also, when starting the communication with the internal circuit 18, the control circuit 25 displays on the LCD 51 a communicating image indicating that communication is ongoing.

Figure 3:
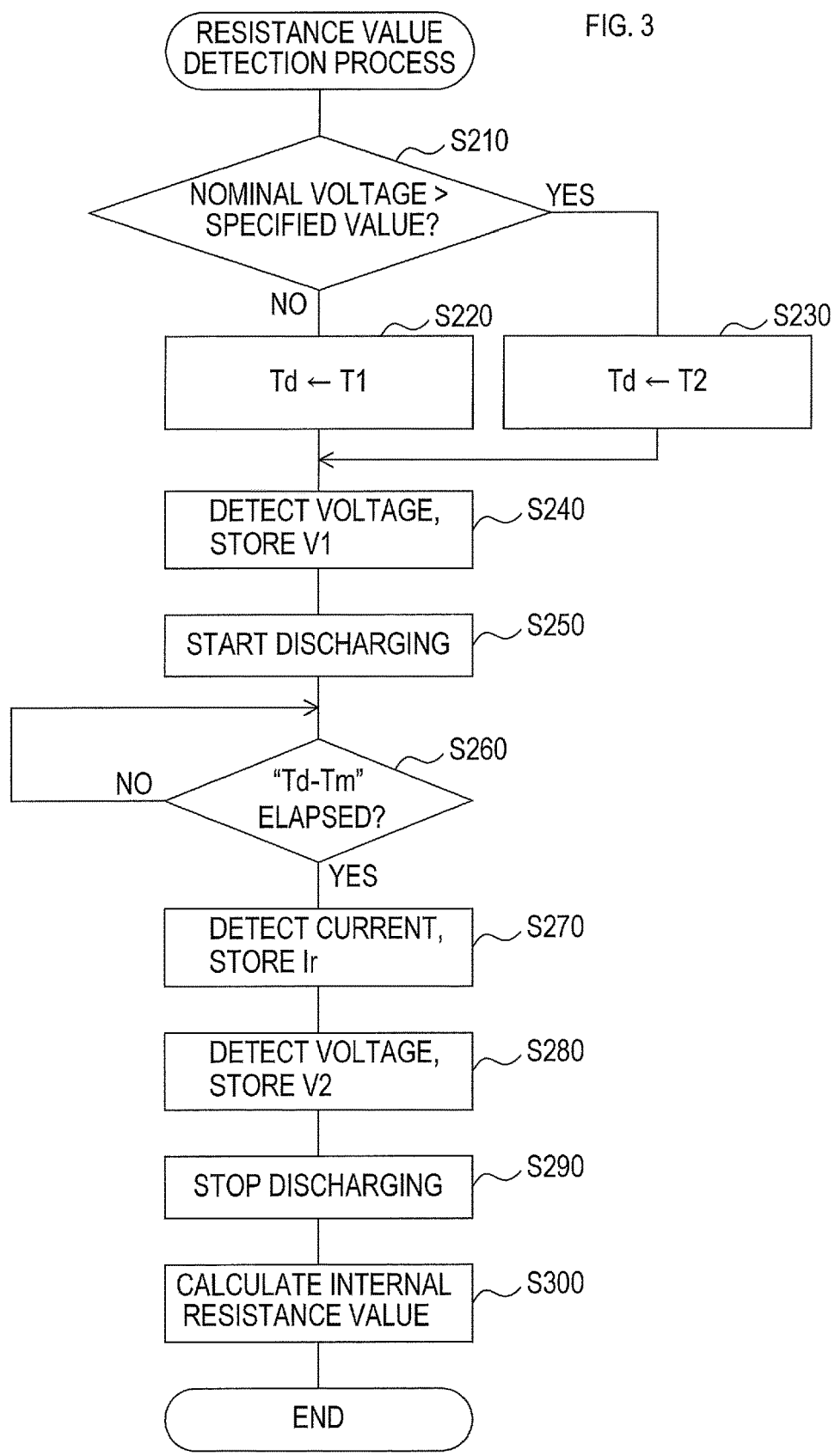
FIG. 3 is a flowchart showing a resistance value detection process of the first embodiment.

Then, the control circuit 25 executes, in S130, a resistance value detection process shown in FIG. 3 to detect an internal resistance value of the attached battery 15. The resistance value detection process will be described in details later.

After completing the resistance value detection process, the control circuit 25 executes, in S140, a display preparation process, which is a process for preparing to display information on the LCD 51.

Subsequently, the control circuit 25 executes, in S150, a display process shown in FIG. 5 to display a diagnosis result of the battery pack 12 on the LCD 51. The diagnosis result displayed on the LCD 51 includes the internal resistance value detected in the resistance value detection process of S130. The display process will be described later.

<Resistance Value Detection Process>

As shown in FIG. 3, when starting the resistance value detection process in S130 of FIG. 2, the control circuit 25 determines, in S210, whether the nominal voltage value of the battery pack 12 is larger than a specified value Vth. In S210, the control circuit 25 detects the nominal voltage value of the battery pack 12 based on the nominal voltage ID obtained from the internal circuit 18. In the present embodiment, the nominal voltage value indicated by the nominal voltage ID is detected as the nominal voltage value of the battery pack 12. Then, the control circuit 25 determines, in S210, whether the detected nominal voltage value is larger than the specified value Vth. The specified value Vth may be, for example, 18 V.

If the control circuit 25 determines, in S210, that the nominal voltage value is not larger than the specified value Vth (that is, equal to or less than the specified value Vth), the control circuit 25 sets a discharge time Td to a first time T1 in S220, and then proceeds to S240. The discharge time Td is a time period during which the attached battery 15 is discharged by the discharge circuit 26. The first time T1 may be, for example, one second.

If the control circuit 25 determines, in S210, that the nominal voltage value is larger than the specified value Vth, the control circuit 25 sets the discharge time Td to a second time T2 in S230, and then proceeds to S240. The second time T2 is shorter than the first time T1, and may be, for example, four milliseconds.

Figure 4:
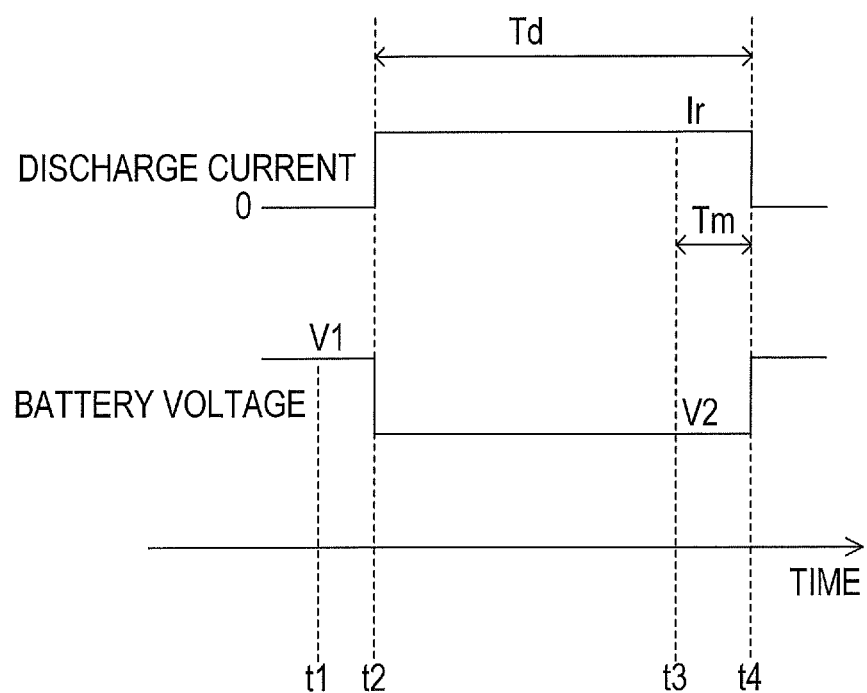
FIG. 4 is a time chart showing the details of the resistance value detection process.

In S240, the control circuit 25 detects the value of the battery voltage as indicated at a time point t1 in FIG. 4, and stores the value as a detected value V1. Specifically, as described above, the measurement switch 37 is turned on to detect a value of a voltage of the input terminal P2, and the value of the battery voltage is calculated from the detected value. Then, the calculated value is stored as the detected value V1. It is to be noted that the control circuit 25 keeps the measurement switch 37 on until a later-described process of S280 is completed.

In S250, the control circuit 25 starts discharging the attached battery 15 by the discharge circuit 26 as indicated at a time point t2 in FIG. 4. Specifically, the control circuit 25 changes the voltage level of the output terminal P4 from Low to High, and also changes the voltage level of the output terminal P5 from High to Low, thus starting operation of the discharge circuit 26.

In S260, the control circuit 25 determines whether a measurement timing has arrived. Specifically, the control circuit 25 determines whether a time period (Td−Tm) that is shorter by a required measurement time Tm than the discharge time Td set in S220 or S230 has elapsed since starting discharge of the attached battery 15. The required measurement time Tm is a time period that is required to measure the value of the battery voltage during discharge and the actual value of the discharge current, and specifically a time period required to execute later-described processes of S270 and S280. The control circuit 25 waits until the measurement timing arrives in S260, and proceeds to S270 when determining that the measurement timing has arrived.

In S270, the control circuit 25 detects the actual value of the discharge current from the attached battery 15 as indicated at a time point t3 in FIG. 4, and then stores the actual value as a detected value Ir. Specifically, as described above, the control circuit 25 detects the value of the voltage of the input terminal P3, and calculates the value Ic of the discharge current based on the detected value. Then, the calculated value Ic is stored as the detected value Ir.

Further, the control circuit 25 detects the value of the battery voltage in S280 in the same manner as in S240, and stores the detected value as a detected value V2.

In S290, the control circuit 25 stops discharging of the attached battery 15 by the discharge circuit 26 as indicated at a time point t4 in FIG. 4. Specifically, the control circuit 25 changes the voltage level of the output terminal P4 from High to Low, and also changes the voltage level of the output terminal P5 from Low to High, to thereby stop operation of the discharge circuit 26. A time period from determination in S260 that the measurement timing has arrived until completion of the process of S280 is the aforementioned required measurement time Tm. Thus, discharging of the attached battery 15 is performed during the discharge time Td.

In S300, the control circuit 25 calculates an internal resistance value Rb of the attached battery 15 according to Formula (1) below using the detected values V1, Ir, and V2 respectively stored in S240, S270, and S280, and then terminates the resistance value detection process. The internal resistance value Rb calculated in S300 is a detection result of the internal resistance value by the resistance value detection process.

$$Rb=(V1-V2)/Ir \quad \text{Formula (1)}$$

In each of S240 and S280, the value of the battery voltage may be calculated by detecting the value of the voltage of the input terminal P2 a plurality of times, and using an average value of a plurality of values obtained by the plurality of detections. Similarly, in S270, the value of the discharge current may be calculated by detecting the value of the voltage of the input terminal P3 a plurality of times, and using an average value of a plurality of values obtained by the plurality of detections. Alternatively, the procedure wherein the process of detecting the value of the voltage of the input terminal P3 in S270 is immediately followed by the process of detecting the value of the voltage of the input terminal P2 in S280 may be performed a plurality of times at specified time intervals.

Also, in S260, whether the measurement timing has arrived may be determined based on whether the discharge time Td has elapsed. In this case, an actual discharge time is the sum (Td+Tm) of the discharge time Td and the required measurement time Tm.

<Display Process>

Figure 5:
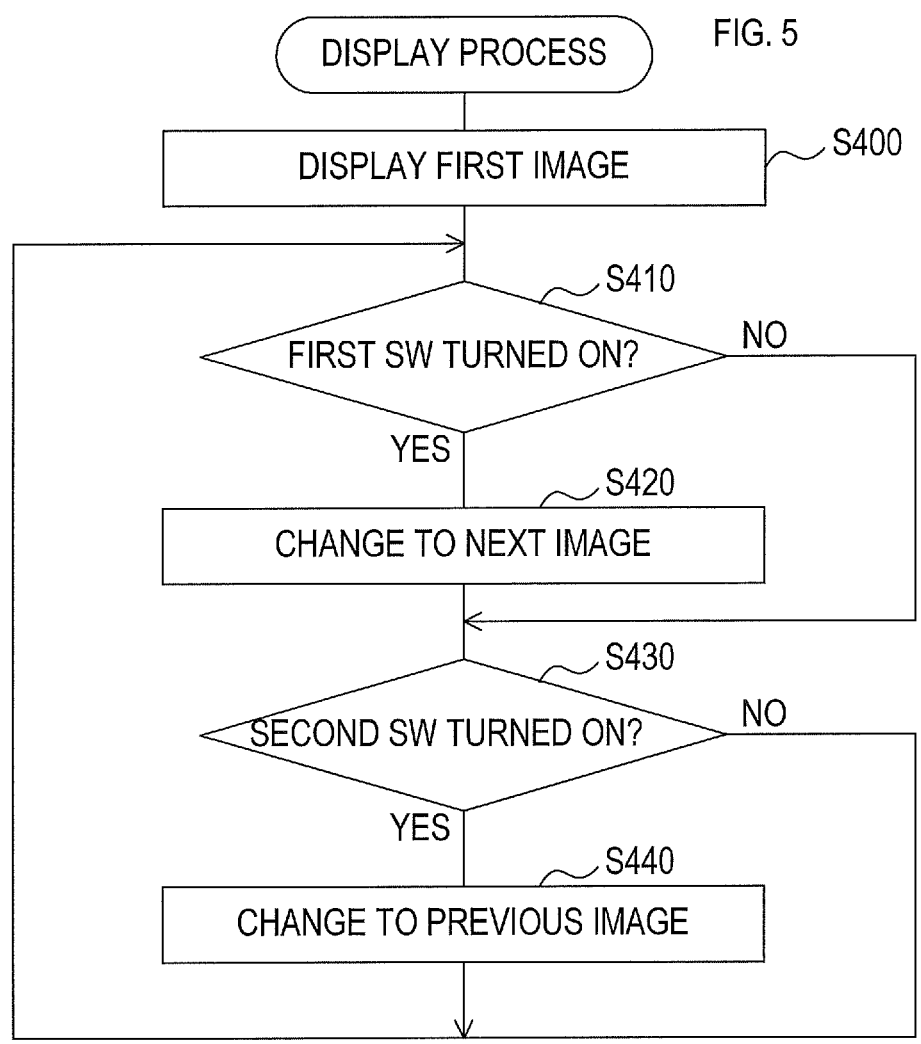
FIG. 5 is a flowchart showing a display process.

As shown in FIG. 5, when starting the display process in S150 of FIG. 2, the control circuit 25 displays a first image on the LCD 51 in S400. The first image is one of a plurality of diagnosis result images showing the diagnosis result of the battery pack 12. By the process of S400, an image displayed on the LCD 51 (hereinafter, a "display image") is changed from the aforementioned communicating image to the first image. As shown in FIG. 6, the diagnosis result images include the first image to a fourth image in the present embodiment. A display order of the first to fourth images is specified as "the first image→the second image→the third image→the fourth image→the first image." Details of each of the first to fourth images will be described later.

In S410, the control circuit 25 determines whether the first switch 53 is turned on, and proceeds to S420 if determining that the first switch 53 is turned on.

In S420, the control circuit 25 changes the display image to an image in the next display order. For example, if the display image when proceeding to S420 is the first image, the display image is to be changed to the second image. For example, if the display image when proceeding to S420 is the fourth image, the display image is to be changed to the first image. When completing the process of S420, or determining in S410 that the first switch 53 is not turned on, the control circuit 25 proceeds to S430.

In S430, the control circuit 25 determines whether the second switch 54 is turned on, and proceeds to S440 if determining that the second switch 54 is turned on.

In S440, the control circuit 25 changes the display image to an image in the previous display order among the first image to the fourth image. For example, if the display image when proceeding to S440 is the first image, the display image is changed to the fourth image. For example, if the display image when proceeding to S440 is the fourth image, the display image is changed to the third image. When completing the process of S440, or determining in S430 that the second switch 54 is not turned on, the control circuit 25 returns to S410.

Since the display process as described above is executed, the user can change the display image to an intended image among the first image to the fourth image by operating the first switch 53 or the second switch 54.

<Details of First Image to Fourth Image>

«First Image»

As shown in FIG. 6, the first image comprises an upper section 1a, a middle section 1b, and a lower section 1c.

In the upper section 1a of the first image, the number of charges obtained from the internal circuit 18 is displayed as a numerical value.

In the middle section 1b of the first image, a battery remaining energy obtained from the internal circuit 18 is displayed as a bar graph. In this bar graph, a state where a black bar extends from a left end to a right end indicates a fully-charged state. Although the term "black" is used here for the purpose of convenience, the term "black" is intended to mean a color that is different from a background color on the monochrome LCD 51, but is not limited to black color. The battery remaining energy to be displayed in the middle section 1b of the first image may be estimated, for example, from the value of the battery voltage detected in S240 or S280 of FIG. 3.

In the lower section 1c of the first image, the internal resistance value of the battery 15 calculated in S300 of FIG. 3 is displayed as a numerical value.

«Second Image»

As shown in FIG. 6, the second image comprises an upper section 2a, a middle section 2b, and a lower section 2c, similarly to the first image.

In the upper section 2a of the second image, the battery life obtained from the internal circuit 18 is displayed as a bar graph. In this bar graph, a black part decreases as the battery 15 deteriorates.

In the middle section 2b of the second image, the over-discharge tendency obtained from the internal circuit 18 is displayed as a percentage value.

In the lower section 2c of the second image, the overload operation rate obtained from the internal circuit 18 is displayed as a percentage value.

«Third Image»

As shown in FIG. 6, the third image comprises an upper section 3a and a lower section 3b.

In the upper section 3a of the third image, the detected value of the battery voltage is displayed as a numerical value. The numerical value displayed in the upper section 3a is, for example, the detected value V1 stored in S240 of FIG. 3.

In the lower section 3b of the third image, the block voltages obtained from the internal circuit 18 are displayed as bar graphs of the respective blocks. In the example in FIG. 6, in which five blocks are provided, five bar graphs are displayed.

«Fourth Image»

The fourth image is a failure location image displaying presence/absence of a failure and a failure location. As shown in FIG. 6, the fourth image comprises a failure mark 4a, a cell failure mark 4b, and a circuit failure mark 4c. The failure mark 4a indicates presence/absence of a failure. The cell failure mark 4b indicates presence/absence of a failure of a cell in the battery 15 (hereinafter referred to as a "cell failure"). The circuit failure mark 4c indicates presence/absence of a failure of the internal circuit 18 (hereinafter referred to as a "circuit failure").

Figure 7:
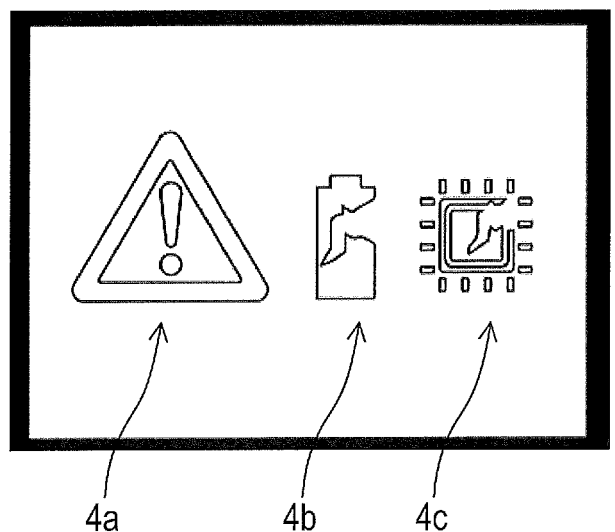
FIG. 7 is a first explanatory diagram illustrating a display form of marks in the fourth image.

If no failure is detected, the marks 4a, 4b, and 4c of the fourth image are displayed in white only with black outlines (hereinafter referred to as a "non-filled form") as shown in FIG. 7. Here, white means a background color on the LCD 51.

If any failure is detected, the failure mark 4a is displayed in a form where outlined areas are filled with black (hereinafter referred to as a "filled form") as shown in FIG. 6.

In particular, if a cell failure is detected as a failure, and specifically, if the cell diagnosis result obtained from the internal circuit 18 is a result indicating a failure, the cell failure mark 4b and the failure mark 4a are displayed in the filled form as shown in FIG. 6.

Figure 8:
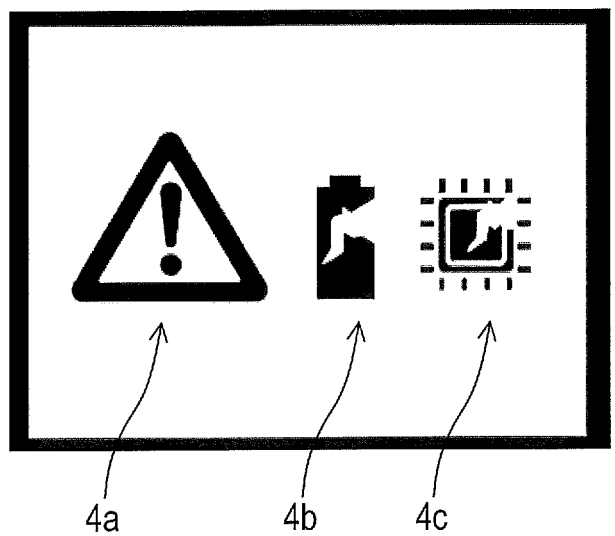
FIG. 8 is a second explanatory diagram illustrating a display form of the marks in the fourth image.

If a circuit failure is detected as a failure, and specifically if the circuit diagnosis result obtained from the internal circuit 18 is a result indicating a failure, the circuit failure mark 4c and the failure mark 4a are displayed in the filled form as shown in FIG. 8. Here, FIG. 8 shows a display form of the fourth image when both a cell failure and a circuit failure are detected, and only the failure mark 4a and the circuit failure mark 4c are displayed in the filled form if only a circuit failure is detected.

If a detected failure is not either a cell failure or a circuit failure, only the failure mark 4a is displayed in the filled form.

In other words, if any failure is detected, the failure mark 4a is displayed in the filled form; if a cell failure is detected, the cell failure mark 4b is displayed in the filled form in addition to the failure mark 4a; if a circuit failure is detected, the circuit failure mark 4c is displayed in the filled form in addition to the failure mark 4a. If a failure location cannot be specified, or if a failure location can be specified but the failure is other than a cell failure or a circuit failure, only the failure mark 4a is displayed in the filled form.

<Mark Display Setting Process>

Figure 9:
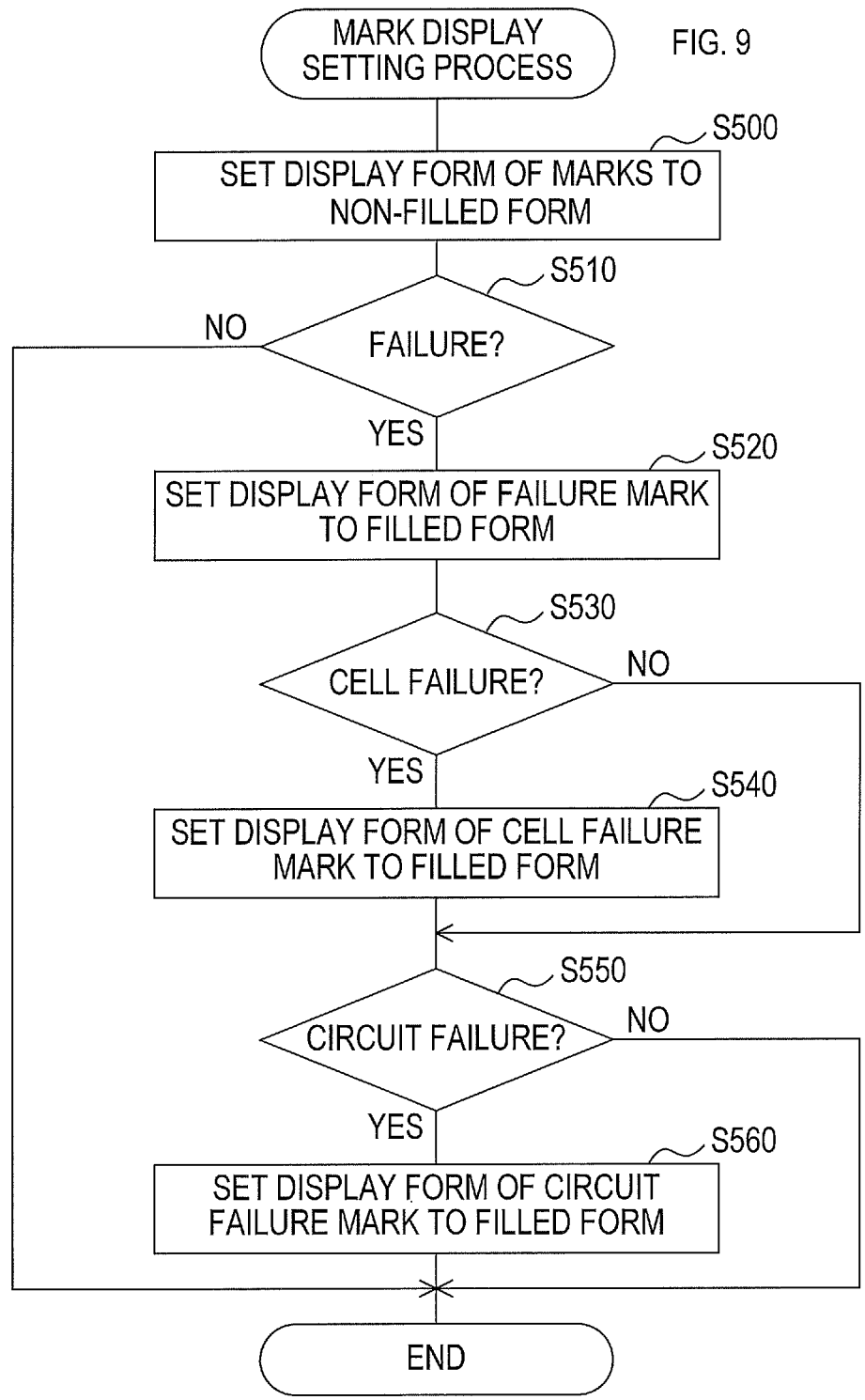
FIG. 9 is a flowchart showing a mark display setting process.

The changes in the display form of the marks 4a, 4b, and 4c in the fourth image are achieved by execution of a mark display setting process in FIG. 9 by the control circuit 25 as one of the display preparation processes in, for example, S140 of FIG. 2.

As shown in FIG. 9, in the mark display setting process, the control circuit 25 first sets the display form of the marks 4a, 4b, and 4c to the non-filled form in S500.

Then, in S510, the control circuit 25 determines whether there is any failure. Specifically, the control circuit 25 determines that there is no failure if neither the cell diagnosis result nor the circuit diagnosis result obtained from the internal circuit 18 indicates a failure, and no other failure is detected. The control circuit 25 determines that there is a failure if at least one of the cell diagnosis result or the circuit diagnosis result indicates a failure, or any other failure is detected.

In this case, other failure may include only a failure related to the battery pack 12, but may include a failure related to the battery checker 11. Also, a failure related to the battery checker 11 may include a failure of the discharge circuit 26. For example, the control circuit 25 may determine whether the value of the discharge current measured in S270 of FIG. 3 deviates from the aforementioned value Ic of the discharge current, which is a designed set value, by a specified value or more, and then may determine that there is a failure of the discharge circuit 26 if there is a deviation of the specified value or more.

If determining that there is no failure in S510, the control circuit 25 simply terminates the mark display setting process. Thus, in this case, the display form of the marks 4a, 4b, and 4c is set to the non-filled form.

If determining that there is a failure in S510, the control circuit 25 proceeds to S520, sets the display form of the failure mark 4a to the filled form, and then proceeds to S530.

In S530, the control circuit 25 determines whether there is a cell failure based on the cell diagnosis result obtained from the internal circuit 18, and proceeds to S540 if determining that there is a cell failure.

In S540, the control circuit 25 sets the display form of the cell failure mark 4b to the filled form, and then proceeds to S550. If determining that there is no cell failure in S530, the control circuit 25 simply proceeds to S550.

In S550, the control circuit 25 determines whether there is a circuit failure based on the circuit diagnosis result obtained from the internal circuit 18, and then proceeds to S560 if determining that there is a circuit failure.

In S560, the control circuit 25 sets the display form of the circuit failure mark 4c to the filled form, and then terminates the mark display setting process. If determining that there is no circuit failure in S550, the control circuit 25 simply terminates the mark display setting process.

In a case of changing the display image to the fourth image in the display process of FIG. 5, the control circuit 25 displays the marks 4a, 4b, and 4c in the display form set in the mark display setting process in FIG. 9.

The mark display setting process in FIG. 9 may be executed, for example, immediately before each change of the display image to the fourth image.

<Mounting State of Transistor>

Figure 10:
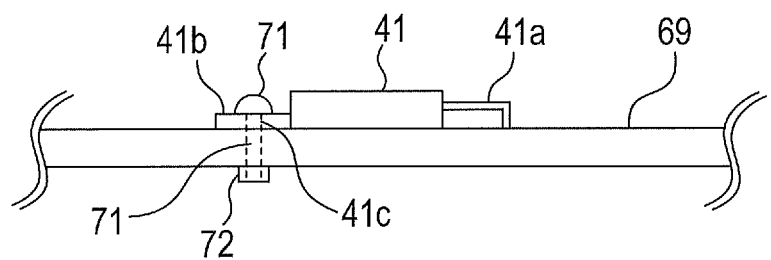
FIG. 10 is an explanatory diagram illustrating a mounting state of a transistor.

As shown in FIG. 10, the transistor 41 is mounted on a circuit board 69 included in the battery checker 11. More specifically, the transistor 41 is mounted on the circuit board 69 in a laterally extending state such that one surface (a rear surface in the present embodiment) of the transistor 41 contacts one surface (an upper surface in the present embodiment) of the circuit board 69. The circuit board 69 may be a printed circuit board or may be a circuit board of a different type. The transistor 41 comprises a heat dissipation piece 41b on a side opposite to a terminal 41a, and the heat dissipation piece 41b comprises a hole 41c for fixation. Although only the terminal 41a is shown in FIG. 10, there actually are three terminals, i.e., a terminal corresponding to the base, a terminal corresponding to the emitter, and a terminal corresponding to the collector. The transistor 41 is fixed to the circuit board 69 by a screw 71 passing through the hole 41c and a nut 72.

<Effects>

According to the first embodiment detailed above, the following effects can be achieved.

(a) The control circuit 25 determines, in S210 of FIG. 3, whether the nominal voltage value of the battery pack 12 attached to the attachment portion 13 is larger than the specified value Vth. If determining that the nominal voltage value is equal to or less than the specified value Vth, the control circuit 25 sets the discharge time Td to detect the internal resistance value of the attached battery 15 to the first time T1. This process is achieved by S220 of FIG. 3. On the other hand, if determining that the nominal voltage value is larger than the specified value Vth, the control circuit 25 sets the discharge time Td to the second time T2 that is shorter than the first time T1. This process is achieved by S230 of FIG. 2. In other words, the control circuit 25 reduces the discharge time Td when determining as "nominal voltage>Vth" as compared with when determining as "nominal voltage≤Vth."

Accordingly, when the nominal voltage value of the battery pack 12 is larger than the specified value Vth, the discharge time Td is reduced as compared with when the nominal voltage value of the battery pack 12 is equal to or less than the specified value Vth. Thus, power consumption and heat generation in the transistor 41 can be reduced when measuring the internal resistance value of the battery pack 12 having a nominal voltage value larger than the specified value Vth.

Accordingly, it is possible to use a compact transistor with a low rated power as the transistor 41, or to omit the heat dissipation fin to be mounted to the transistor 41. In a case of providing the heat dissipation fin to the transistor 41, a compact heat dissipation fin is sufficient. This enables downsizing of the battery checker 11.

Setting the discharge time Td to a fixed short time period is likely to lead to a decrease in calculation accuracy of the internal resistance value for any type of battery pack. In contrast, according to the battery checker 11 of the first embodiment, it is possible to avoid or inhibit a decrease in calculation accuracy of the internal resistance value at least for a battery pack with a nominal voltage value equal to or less than the specified value Vth. That is, the battery checker 11 enables achievement of a total performance and downsizing of the battery checker 11 in a well-balanced manner.

(b) A configuration capable of changing the discharge time Td can be achieved without providing any additional hardware configuration to the discharge circuit 26, as compared with a configuration incapable of changing the discharge time Td. Accordingly, the configuration capable of changing the discharge time Td can easily achieve a simplified configuration of the battery checker 11, and thus can contribute to downsizing of the battery checker 11.

(c) The control circuit 25 detects the nominal voltage value based on the nominal voltage ID obtained from the battery pack 12 in S210 of FIG. 3. Thus, it is possible to detect the nominal voltage value correctly.

Data that enables to specify the nominal voltage value may be, for example, the data indicating the model number of the battery pack 12 (hereinafter referred to as "model number data") as described above. In this case, it may be configured, for example, such that a data map representing a correspondence relationship between the model number of the battery pack 12 and the nominal voltage value is stored in the flash memory 33, or the like, and that the control circuit 25 detects the nominal voltage value based on the data map and the model number data.

(d) The transistor 41 is mounted on the circuit board 69 in a laterally extending state as described with reference to FIG. 10. Accordingly, it is possible to dissipate heat in the transistor 41 from the transistor 41 to the circuit board 69, and thus to use a more compact transistor as the transistor 41. Further, it is possible to reduce the height of the transistor 41 mounted on the circuit board 69. Thus, further downsizing of the battery checker 11 can be easily achieved.

(e) The control circuit 25 causes the calculated internal resistance value to be displayed on the LCD 51, more specifically, in the lower section 1c of the first image. Thus, the user can see a measurement result of the internal resistance value.

(f) The non-filled form of each of the marks 4a, 4b, and 4c in the fourth image displayed on the LCD 51 is the display form indicating absence of failure, whereas the filled form is the display form indicating presence of failure. That is, the fourth image indicates normal or failure in a distinctive manner by using the non-filled form and the filled form. Thus, the user can easily recognize presence/absence of failure, that is, whether it is normal or abnormal by the display form of the failure mark 4a. Also, the user can easily determine whether the occurring failure is a cell failure, a circuit failure, or other failure by a combination of the display forms of the cell failure mark 4b and the circuit failure mark 4c.

Further, the failure mark 4a is a figure having an exclamation mark that is suggestive of failure, the cell failure mark 4b is a figure representing a battery that is suggestive of a cell, and the circuit failure mark 4c is a figure representing an IC that is suggestive of a circuit. As described above, the marks 4a, 4b, and 4c, are so to speak icons each having a shape suggestive of a meaning of the mark; thus, it is possible to achieve the battery checker 11 that can be used by various users using different languages.

Each of the cell failure mark 4b and the circuit failure mark 4c may be a mark indicating presence/absence of a different failure. Also, the fourth image may comprise only one mark, or three or more marks, in addition to the failure mark 4a.

In the present embodiment, the control circuit 25 functions as one example of each of a discharge performing device, a voltage value detector, a calculator, a changer, a display processor. S250, S260, and S290 of FIG. 3 correspond to one example of a process as the discharge performing device; S240 and S280 of FIG. 3 correspond to one example of a process as the voltage value detector. The battery voltage measured in S240 corresponds to one example of the first voltage, whereas the battery voltage measured in S280 corresponds to one example of the second voltage. S300 of FIG. 3 corresponds to one example of a process as the calculator, whereas S210, S220, and S230 of FIG. 3 correspond to one example of a process of the changer. S150 of FIG. 2 corresponds to one example of a process as the display processor.

Second Embodiment

A second embodiment has a basic configuration that is similar to that of the first embodiment. Accordingly, configurations of the second embodiment that are common with the first embodiment will not be further described herein, and the second embodiment will be described focusing on differences from the first embodiment. The same reference numerals as in the first embodiment denote the same configurations, and the preceding descriptions will be referred to.

Figure 11:
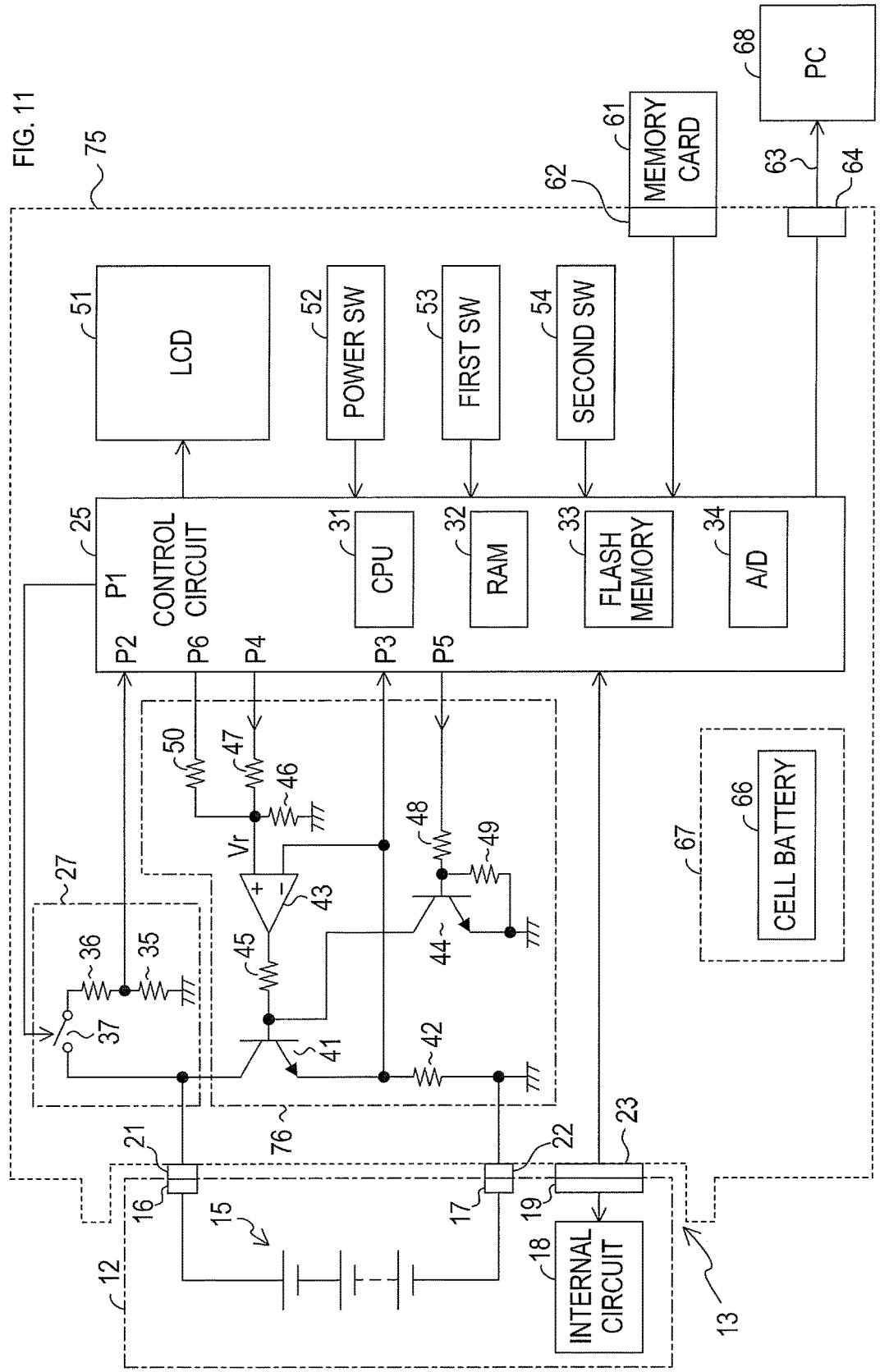
FIG. 11 is a configuration diagram showing a configuration of a battery checker of a second embodiment.

A battery checker 75 of the second embodiment shown in FIG. 11 has following differences (D1), (D2), and (D3) from the battery checker 11 of the first embodiment.

(D1) As shown in FIG. 11, the battery checker 75 comprises a discharge circuit 76 in place of the discharge circuit 26 in FIG. 1. The discharge circuit 76 is different from the discharge circuit 26 in that the discharge circuit 76 further comprises a resistor 50. A first end of the resistor 50 is coupled to a connection point between the resistor 46 and the resistor 47 and to the non-inverting input terminal of the operational amplifier 43, whereas a second end of the resistor 50 is coupled to an output terminal P6 of the control circuit 25.

(D2) When stopping operation of the discharge circuit 76, the control circuit 25 sets the voltage levels of the output terminals P4 and P6 to Low, and also sets the voltage level of the output terminal P5 to High.

In contrast, when causing the discharge circuit 76 to operate, the control circuit 25 operates in either a first mode or a second mode described below.

«First Mode»

In the first mode, the control circuit 25 sets the output terminal P6 to a high impedance state, sets the voltage level of the output terminal P4 to High, and sets the voltage level of the output terminal P5 to Low.

Accordingly, when the control circuit 25 operates in the first mode, the voltage of the non-inverting input terminal of the operational amplifier 43 is a voltage obtained by dividing the voltage of the output terminal P4 when the voltage level is set to High by the resistors 46 and 47 in the same manner as in the first embodiment. Thus, a value Ic1 of the constant discharge current discharged from the attached battery 15 via the transistor 41 is represented by "Vr1/R42" in a case where the value of the voltage divided by the resistors 46 and 47 is Vr1.

«Second Mode»

In the second mode, the control circuit 25 sets the output terminal P4 to a high impedance state, sets the voltage level of the output terminal P6 to High, and sets the voltage level of the output terminal P5 to Low.

Accordingly, when the control circuit 25 operates in the second mode, the voltage of the non-inverting input terminal of the operational amplifier 43 is a voltage obtained by dividing the voltage of the output terminal P6 when the voltage level is set to High by the resistors 46 and 50. Thus, a value Ic2 of the constant discharge current discharged from the attached battery 15 via the transistor 41 is represented by "Vr2/R42" in a case where the value of the voltage divided by the resistors 46 and 50 is Vr2.

A resistance value of the resistor 50 is set to be larger than a resistance value of the resistor 47. Thus, the value Vr2 in the second mode is smaller than the value Vr1 in the first mode, and consequently the value Ic2 in the second mode is smaller than the value Ic1 in the first mode. In the present embodiment, respective resistance values of the resistors 46, 47, and 50, and R42 are selected such that, for example, the value Ic1 is 2 amperes and the value Ic2 is 0.2 amperes.

Figure 12:
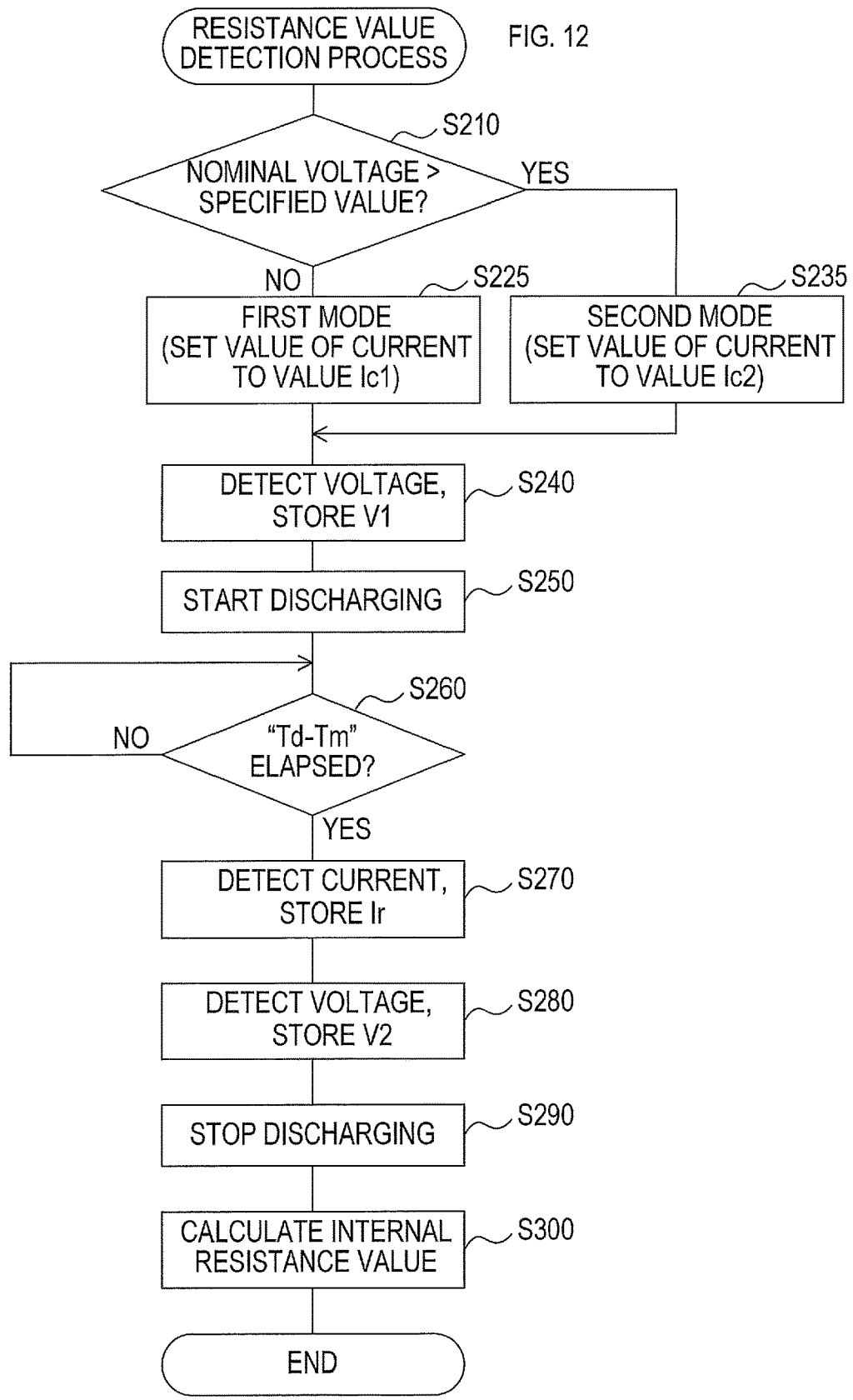
FIG. 12 is a flowchart showing a resistance value detection process of the second embodiment.

(D3) The control circuit 25 executes a resistance value detection process of FIG. 12 in place of the resistance value detection process of FIG. 3. Processes in FIG. 12 that are the same as those in FIG. 3 are assigned the respective same step numbers and will not be further described.

The resistance value detection process of FIG. 12 is different from the resistance value detection process of FIG. 3 in that S225 is performed in place of S220, and S235 is performed in place of S230.

As shown in FIG. 12, if determining in S210 that the nominal voltage value is not larger than the specified value Vth, the control circuit 25 proceeds to S225, and sets the operation mode of the control circuit 25 to the aforementioned first mode.

If determining in S210 that the nominal voltage value is larger than the specified value Vth, the control circuit 25 proceeds to S235, and sets the operation mode of the control circuit 25 to the aforementioned second mode.

In S250, the control circuit 25 operates in the operation mode set in S225 or S235, to thereby start operation of the discharge circuit 76.

In the second embodiment, the discharge time Td is a fixed time period, which is, for example, the same time as the first time T1 in the first embodiment. That is, in the second embodiment, the value of the discharge current discharged from the attached battery 15 via the transistor 41 is changed instead of changing the discharge time Td.

Specifically, if determining that the nominal voltage value of the battery pack 12 is equal to or less than the specified value Vth, the control circuit 25 operates in the first mode to thereby set the value of the discharge current to the value Id, whereas if determining that the nominal voltage value is larger than the specified value Vth, the control circuit 25 operates in the second mode to thereby set the value of the discharge current to the value Ic2 that is smaller than the value Ic1.

According to the battery checker 75 of the second embodiment as described above, it is also possible to reduce power consumption and heat generation in the transistor 41 when measuring the internal resistance value of the battery pack 12 having a nominal voltage value larger than the specified value Vth. Thus, the same effect as the effect (a) among the aforementioned effects in the first embodiment can be achieved. Also, the effects (c) to (f) can be achieved.

In the second embodiment, S210, S225, and S235 of FIG. 12 correspond to one example of a process as a changer.

In the second embodiment, the value of the discharge current may be changed, for example, by changing the voltage of the output terminal P4 using a D/A converter, or the like, instead of additionally providing the resistor 50. In this case, the control circuit 25 may set the voltage of the output terminal P4 to a specified voltage (for example, 3.3 V) in the first mode, and may set the voltage of the output terminal P4 to a voltage that is lower than the aforementioned specified voltage in the second mode.

Other Embodiments

Although some embodiments of the present disclosure have been described above, the present disclosure is not limited to the above-described embodiments, but may be practiced in various forms. Also, the aforementioned values are merely examples, and other values may be employed.

Figure 13:
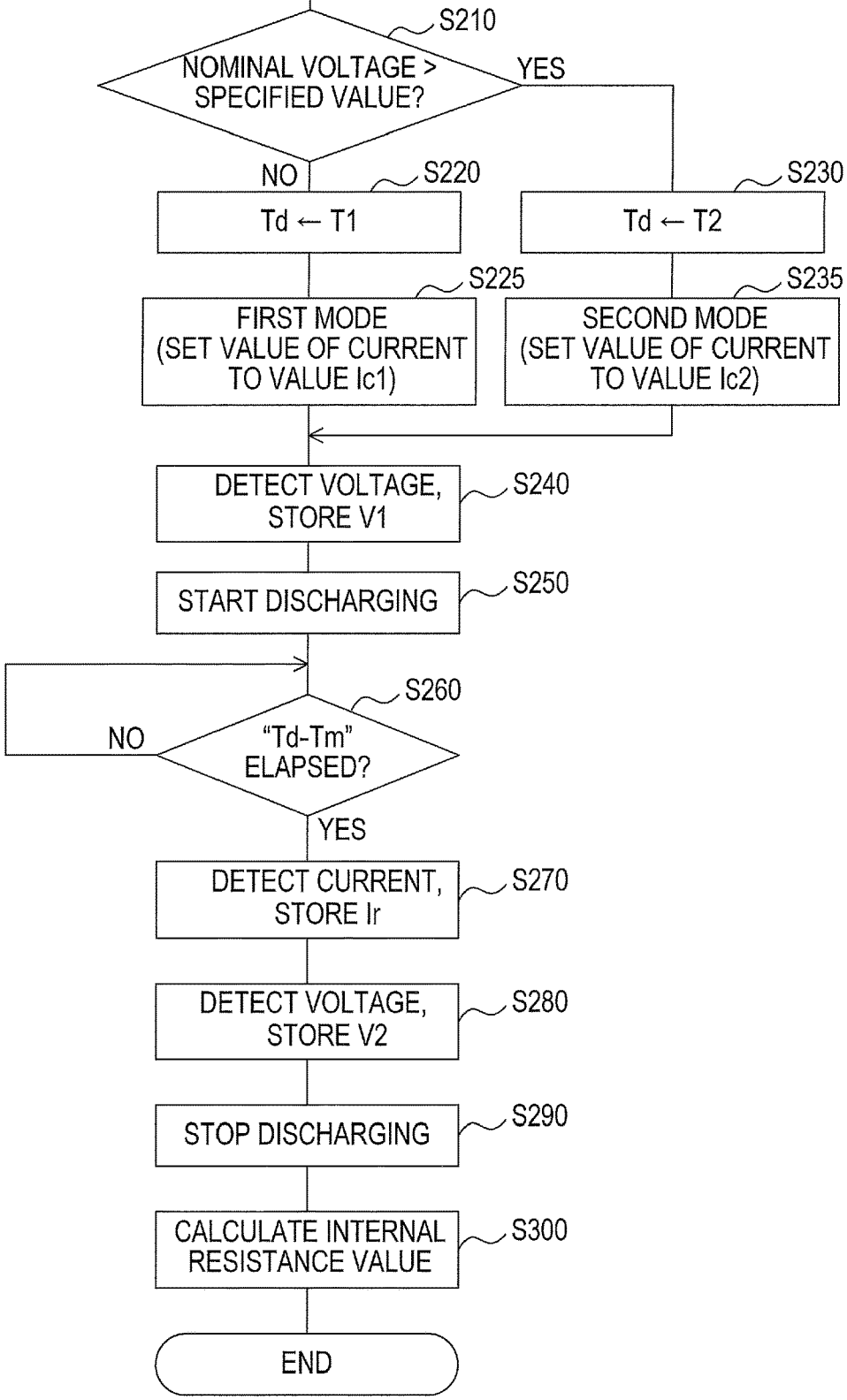
FIG. 13 is a flowchart showing a resistance value detection process of a modified example.

In the present disclosure, it may be possible to combine the first embodiment and the second embodiment and change both of the discharge time and the discharge current. Specifically, it may be possible to combine the first embodiment and the second embodiment so as to execute a process shown in FIG. 13.

The control circuit 25 may be configured to detect the nominal voltage value of the battery pack 12 based on the detected value of the battery voltage in S210 of FIG. 3. In this case, in the resistance value detection process of FIG. 3, the process of S240 may be performed, for example, prior to S210, and the nominal voltage value may be detected in S210 based on the detected value V1 stored in S240. Also, as a method for detecting the nominal voltage value based on the detected value of the battery voltage, the following method, for example, may be employed. Specifically, in the method, a data map representing a corresponding relationship between the value of the battery voltage and the nominal voltage value may be stored in the flash memory 33, or the like, and the control circuit 25 may detect the nominal voltage value based on the data map and the detected value of the battery voltage. In this case, the control circuit 25 can determine the nominal voltage even if the aforementioned nominal voltage ID cannot be obtained from the battery pack 12. Such a modification may be also applied to the second embodiment in a similar manner.

In each of the first embodiment and the second embodiment, a method is employed in which it is determined whether the nominal voltage value is larger than the specified value Vth, and the discharge time or the discharge current is reduced if the nominal voltage value is larger than the specified value Vth. That is, a single threshold value (i.e., the specified value Vth) is set, and the discharge time or the discharge current is changed depending on whether the nominal voltage value is larger than the threshold value. In the present disclosure, a plurality of threshold values may be used to change the discharge time or the discharge current in a multi-stepwise manner in accordance with the nominal voltage.

Also, in the present disclosure, the discharge time or the discharge current may be changed in accordance with the detected value of the battery voltage in place of the nominal voltage value. In this case, the discharge time or the discharge current may be changed in accordance with the detected value of the battery voltage in a non-stepwise manner.

The display image in the first embodiment or the second embodiment may be changed among five or more images, or may be changed among three or less images. Also, the display image may be switched between a detail mode using four images and a simple mode using less images (for example, two images) by a special operation, such as pressing both the first switch 53 and the second switch 54 at the same time. Alternatively, the display image may be switched between the detail mode using four images and an administrator mode using more images (for example, eight images). In the present disclosure, there may be provided a dedicated switch for switching among the detail mode, the simple mode, and the administrator mode.

In S300 of FIG. 3, the internal resistance value Rb may be calculated by substituting the value Ic, which is a set design value of the discharge current, into Formula (1) in place of the value Ir. In this case, it is possible to omit the process to measure the value of the discharge current in S270. Such a modification may be also applied to the second embodiment in a similar manner.

The inspection apparatus is embodied as a separate apparatus, i.e., the battery checker 11 or 75 in the aforementioned embodiments. The inspection apparatus may be configured to be attachable to and detachable from a charger to charge the battery pack, or may be incorporated into the charger.

The method of displaying the fourth image in the aforementioned embodiments, that is, the method in which one of a plurality of marks indicates presence/absence of failure, whereas the remaining marks indicate whether corresponding failures are occurring, may be applied to apparatuses other than a battery checker. For example, this method may be similarly applied to an inspection apparatus to inspect an object other than a battery pack or to other apparatus. Then, according to the apparatus to which this method is applied, a user can easily recognize presence/absence of failure, and easily determine a type of currently occurring failure.

Also, a plurality of functions served by one element in the aforementioned embodiments may be achieved by a plurality of elements, or one function served by one element may be achieved by a plurality of elements. Further, a plurality of functions served by a plurality of elements may be achieved by one element, or one function achieved by a plurality of elements may be achieved by one element. Moreover, part of the configurations in the aforementioned embodiments may be omitted. It is to be understood that any form included in a technical idea defined only by the language of the claims that follow may be an embodiment of the present disclosure. The present disclosure may be achieved, in addition to the aforementioned inspection apparatus, in various forms, such as a system comprising the inspection apparatus as an element, a program to cause a computer to function as the inspection apparatus, a non-transitory physical recording medium storing the program, such as a semiconductor memory, and an internal resistance value measurement method.

What is claimed is:

1. An inspection apparatus of a battery pack for an on-site electric apparatus, the inspection apparatus comprising:
a coupler configured to be coupled to the battery pack, the battery pack comprising a battery having a positive electrode terminal and a negative electrode terminal;
a discharger comprising a transistor, the transistor being coupled between the positive electrode terminal and the negative electrode terminal of the battery in the battery pack coupled to the coupler, and the discharger being configured to discharge the battery via the transistor;
a changer configured to detect one of a nominal voltage value of the battery pack coupled to the coupler and a voltage value of the battery in the battery pack, and to reduce a discharge time of the battery in response to the detected value being larger than a specified value or a discharge current value of the battery in response to the detected value being larger than the specified value;
a discharge performing device configured to cause the discharger to operate during the discharge time to thereby discharge the battery during the discharge time;
a voltage value detector configured to detect a first voltage value and a second voltage value, the first voltage value being a voltage value of the battery before the discharge performing device starts discharging of the battery, and the second voltage value being a voltage value of the battery during discharging of the battery; and
a calculator configured to calculate an internal resistance value of the battery based on the discharge current value and on a difference value between the first voltage value and the second voltage value detected by the voltage value detector,
wherein the discharger further comprises an operational amplifier and a resistor,
an output of the operational amplifier is coupled to a base of the transistor,
a first end of the resistor is coupled to an emitter of the transistor, and
the operational amplifier is configured to adjust a magnitude of current to flow from the output of the operational amplifier into the base such that a voltage at a coupling point between the emitter and the first end of the resistor is equal to a voltage of a non-inverting input terminal of the operational amplifier.

2. The inspection apparatus according to claim 1, further comprising:
a discharge current value detector configured to detect the discharge current value,
wherein the calculator is further configured to calculate the internal resistance value based on the discharge current value detected by the discharge current value detector and on the difference value.

3. The inspection apparatus according to claim 1, wherein the calculator is further configured to calculate the internal resistance value based on the discharge current value that is set and on the difference value.

4. The inspection apparatus according to claim 1, wherein the changer is further configured to determine a magnitude of the detected value based on at least one preset threshold value.

5. The inspection apparatus according to claim 1, wherein the changer is configured to reduce the discharge time.

6. The inspection apparatus according to claim 1, wherein the changer is configured to obtain, from the battery pack, data enabling to specify the nominal voltage value and to detect the nominal voltage value based on the obtained data.

7. The inspection apparatus according to claim 1, wherein the changer is configured to detect the nominal voltage value based on the voltage value of the battery.

8. The inspection apparatus according to claim 1, further comprising:
a circuit board,
wherein the transistor comprises one surface and is mounted on the circuit board such that the one surface contacts the circuit board.

9. The inspection apparatus according to claim 1, further comprising:
a display processor configured to cause a display device to display the internal resistance value calculated by the calculator.

10. The inspection apparatus according to claim 1, wherein the discharger is further configured to discharge the battery constantly at the discharge current value.

11. The inspection apparatus according to claim 1, wherein the discharger is further configured to turn on the transistor to discharge the battery.

12. The inspection apparatus according to claim 1, wherein the coupler is further configured such that the battery pack is attached to the coupler.

13. The inspection apparatus according to claim 1,
wherein the discharge performing device is configured to cause the discharger to operate for a first time in response to the nominal voltage being equal to or less than a specified value, and the discharge performing device is further configured to cause the discharger to operate for a second time in response to the nominal voltage being larger than the specified value, the second time being shorter than the first time.

* * * * *